United States Patent [19]

Cooper et al.

[11] Patent Number: 5,548,236
[45] Date of Patent: * Aug. 20, 1996

[54] PHASE SHIFTING APPARATUS AND METHOD WITH FREQUENCY MULTIPLICATION

[75] Inventors: James C. Cooper, Monte Sereno; Steven J. Anderson, Cupertino, both of Calif.

[73] Assignee: Pixel Instruments, Los Gatos, Calif.

[*] Notice: The portion of the term of this patent subsequent to Sep. 19, 2006, has been disclaimed.

[21] Appl. No.: 396,339

[22] Filed: Feb. 28, 1995

Related U.S. Application Data

[63] Continuation of Ser. No. 89,904, Jul. 6, 1993, abandoned, which is a continuation of Ser. No. 771,328, Oct. 2, 1991, abandoned, which is a continuation-in-part of Ser. No. 404,881, Sep. 8, 1989, Pat. No. 5,097,218, which is a continuation-in-part of Ser. No. 172,283, Mar. 23, 1988, Pat. No. 4,868,428, which is a continuation of Ser. No. 16,923, Feb. 20, 1987, Pat. No. 4,829,257.

[51] Int. Cl.⁶ .................................................. H03H 11/16
[52] U.S. Cl. .......................... 327/237; 327/231; 327/258
[58] Field of Search .................................. 307/262, 529, 307/601; 328/155, 55, 133, 167; 327/231, 237, 238, 239, 254, 255, 258, 259, 355

[56] References Cited

U.S. PATENT DOCUMENTS

| | | | |
|---|---|---|---|
| 4,039,930 | 8/1977 | Lukas | 328/155 |
| 4,607,229 | 8/1986 | Isobe et al. | 328/133 |
| 4,717,843 | 1/1988 | Yoshimura | 328/55 |
| 4,737,724 | 4/1988 | Porrot | 328/155 |
| 4,808,936 | 2/1989 | Lamb | 328/55 |
| 4,829,257 | 5/1989 | Cooper | 328/133 |
| 4,868,428 | 9/1989 | Cooper | 328/133 |
| 4,916,411 | 4/1990 | Lymer | 328/55 |
| 4,951,000 | 8/1990 | Dautriche | 328/55 |
| 5,303,417 | 4/1994 | Laws | 307/529 |

*Primary Examiner*—Toan Tran
*Attorney, Agent, or Firm*—Lightbody & Lucas

[57] ABSTRACT

The present invention provides a phase shifting apparatus and method. The phase shifting apparatus comprises a signal generator and a converting device. An input signal is converted by the offset signals from the signal generator, thereby producing an output signal with the same frequency as that of the input signal. The phase of the output signal is determined by the difference of the offset signals applied to the converting device. In particular, when two offset signals are in quadrature, the output signal becomes in quadrature with the input signal. When the two offset signals have the same phase, the output signal has the same phase as that of the input signal. Preferably, the converting device includes two cascaded offset means, each having a multiplier and a filter coupling to the multiplier. A plurality of converting means may be coupled in parallel to the signal generator. On the basis of the offset signals applied to respective converting means, the phase shifting apparatus provides a plurality of outputs having different phase shifts. The frequency range of the input signal is very width and the phase shifting apparatus may operate in analog and digital forms.

9 Claims, 8 Drawing Sheets

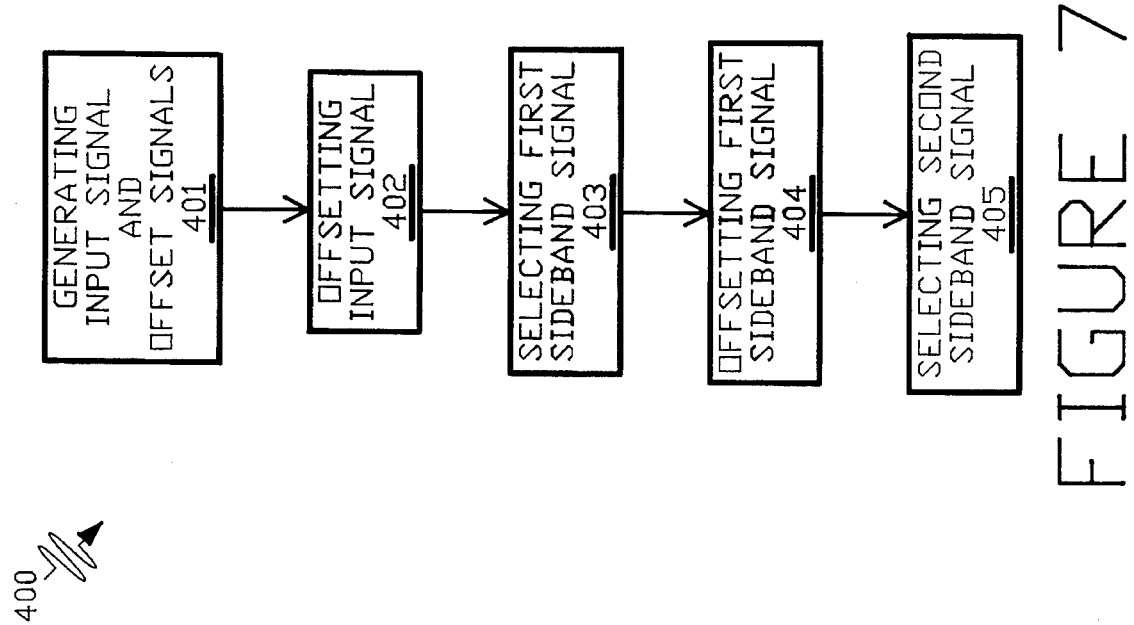

5,548,236

PHASE SHIFTING APPARATUS AND METHOD WITH FREQUENCY MULTIPLICATION

The present application is a continuation of U.S. application Ser. No. 08/089,904 filed Jul. 6, 1993, now abandoned, which '904 application is a continuation of U.S. application Ser. No. 07/771,328 filed Oct. 2, 1991, now abandoned, which '328 application is a continuation in part of U.S. patent application Ser. No. 07/404,881, filed on Sep. 8, 1989 and allowed on May 17, 1991, and issued as U.S. Pat. No. 5,097,218 on Mar. 17, 1992 which '881 application is a continuation in part of U.S. patent application Ser. No. 172,283, filed on Mar. 23, 1988, now U.S. Pat. 4,868,428 issued on Sep. 19, 1989, which is a continuation of application Ser. No. 07/016,923, filed on Feb. 20, 1987, now U.S. Pat. No. 4,829,257, which applications are incorporated by reference.

BACKGROUND OF THE INVENTION

1. Field of the Invention

The present invention relates to the field of multiplying the frequency of complex time varying signals of a repetitive or nonrepetitive nature. In particular, the present invention relates to shifting the phase of a complex signal by frequency multiplication.

2. Description of the Prior Art

Often in electronic system design, it is desirable to multiply the frequency of a given complex time varying signal, having a relatively wide bandwidth of 1 or several octaves. Such as when a complex time varying signal must be regenerated at a new frequency due to tape recording at one speed and playing back at another, or digitizing the signal at a given rate with an A-D converter, buffering in memory and reconstructing the signal via a D-A converter at a different rate. These systems time compress or expand the signal, thereby generating a pitch change which is desired to be corrected.

SUMMARY OF THE INVENTION

The present invention provides a phase shift apparatus for accurately shifting the phase of a signal with a variable frequency content which may occupy one or more octaves of bandwidth. In accordance with the present invention, a phase shift apparatus comprises converting means for generating an output signal with a predetermined phase shift with respect to the input signal.

The phase shift apparatus further comprises signal generator means for providing at least a first and a second offset signals, which two signals are periodic signals. By utilizing the two signals, the phase shift apparatus converts the phase of the variable frequency input signal, thereby producing the output signal.

The bandwidth of the input signal may be varied within relatively large range, even the bandwidth chosen by way of example is within 20—20 KHz. Preferably, the frequencies of the two offset signals are selected to be the same, being at least four times higher than the frequency of the input signal. The phase difference of the two offset signals determines the predetermined phase shift of the output signal. The predetermined phase shift of the output signal is 90 degrees if the two offset signals are in quadrature.

An embodiment of the phase shift apparatus comprises two cascaded offset means with the input signal fed to the first one. In response to the first offset signal, the first offset means converts the frequency and phase of the input signal and provides at least a first intermediate signal. The second offset means couples to the output of the first offset means and converts the frequency and phase of the first intermediate signal in response to the second offset signal, thereby providing the aforementioned output signal having the predetermined phase shift.

Preferably, the first offset means includes a multiplier means and a filter means. The multiplier means is utilized to shift frequency and phase of the input signal by the amount of the first offset signal. The filter means then selects and output the first intermediate signal.

The second offset means has the same components and arrangement as those of the first offset means, the difference between them only being the signals coupling to the multiplier means of the second offset means. The inputs of the second offset means receives the first intermediate signal and the first signal, instead of the input signal and the first signal, which are applied to the multiplier means to generate the output signal.

A further embodiment of the phase shift apparatus comprises a first path means and a delay means. The first path means includes two cascaded means. The input signal is converted by the first and second signals respectively applied to the two means, providing a first output signal with a predetermined phase shift with respect to the input signal. The delay means delays the input signal to produce a second output signal which has the same frequency and phase as those of the input signal. Accordingly, when two signals are in quadrature, the first output signal is in quadrature with the signal. The delay means may also adjust the amplitude of the second output signal.

In accordance with the present invention, another embodiment of the phase shift apparatus comprises a first path means and a second path means, each path means including two cascaded means. In the first path means, the input signal is converted in response to the first and second signals respectively applied to the two means, thereby providing a first output signal with a predetermined phase shift with respect to the input signal. For the second path means, only the second signal is respectively applied to its two means. Therefore, the second path means produces a second output signal having the same frequency as that of the input signal. As a result, the two path means produce two output signals that have a phase difference determined by the phase difference of the first and second signals.

Alternatively, the first path means can be simplified so that it only includes a means. The input signal and the intermediate signal output from the first means of the first path means are applied to the means of the first path means. Thus, the means of the first path means produces an output signal having the predetermined phase shift with respect to the input signal.

An aspect of the present invention is that the input signal can be coupled to a plurality of path means in parallel. Signal generator means can be utilized to generate a plurality of signals respectively applied to the a plurality of path means, further converting phase of the input signal to provide a plurality of parallel output signals. These parallel signals have different phase shifts relating to the input signal. The different phase shifts are determined by the signals applied to the path means. Therefore, the phase shift apparatus in accordance with the present invention can provide a plurality of phase shift signals, each having different phase shift.

In accordance with the present invention, a method of shifting phase of a variable frequency input signal is provided. First and second signals are generated to convert the phase of the input signal. The frequency and phase of the input signal is first frequency shifted by the first signal to provide a combination signal with baseband and higher harmonic components. At least a first baseband signal is selected from these signals. The frequency and phase of the baseband signal is shifted again by the signal so as to produce a combination signal having the same baseband frequency component as that of the input signal and other frequency components. Only the signal component having the same baseband frequency as that of the input signal is selected to be output, providing a first output signal that has the same frequency as that of the input signal and different phase from that of the input signal.

Further, delaying the input signal provides a second output signal. This second output signal has the same frequency and phase as the input signal, thereby two quadrature output signals are provided.

The phase shift apparatus and method in accordance with the present invention can be applied for both analog and digital forms. In digital form, the input signal can be a discrete time signal that is a function of $n*\Omega$ (n is integers and $\Omega<\pi/2$). The first signal is a function of the sum of two discrete signals. The two discrete signals have the same frequency and magnitude but different phase, and are respectively a function of $n*\pi/2$.

An advantage of the phase shift apparatus and method is that a very wide bandwidth is available to provide output signals with accurate phase shift. The present invention can be utilized anywhere a wideband phase shift is needed, such as signal processing, communications, especially single sideband and double sideband suppressed carrier modulation, and for multiplying the frequency of complex time varying signals as taught in the parent application.

Even though the output signals in the preferred embodiments are in quadrature, it is easily to change the phase difference of the output signals by changing the phase difference of the signals. Therefore, the phase difference of the output signals can vary within the range of 360 degrees.

Furthermore, the phase error is inherently accurate. Particularly, in the digital implementation, the phase error is stable due to the linear phase nature of the elements and the advantages of digital technology.

The another advantage of the phase shift apparatus is that it is suitable to be implemented by integrated circuits. Alternatively, the phase shift can be implemented by software, such as in DSP (Digital Signal Processing) applications. These and other features and advantages of the present invention are apparent from the description below with reference to the following drawings.

BRIEF DESCRIPTION OF THE DRAWINGS

FIGS. 2b, 2c are waveform diagrams of the phase shift apparatus shown in FIG. 2a.

FIG. 7 is a flow chart of a shifting phase method in accordance with the present invention.

DESCRIPTION OF THE PREFERRED EMBODIMENTS

Figure 1:
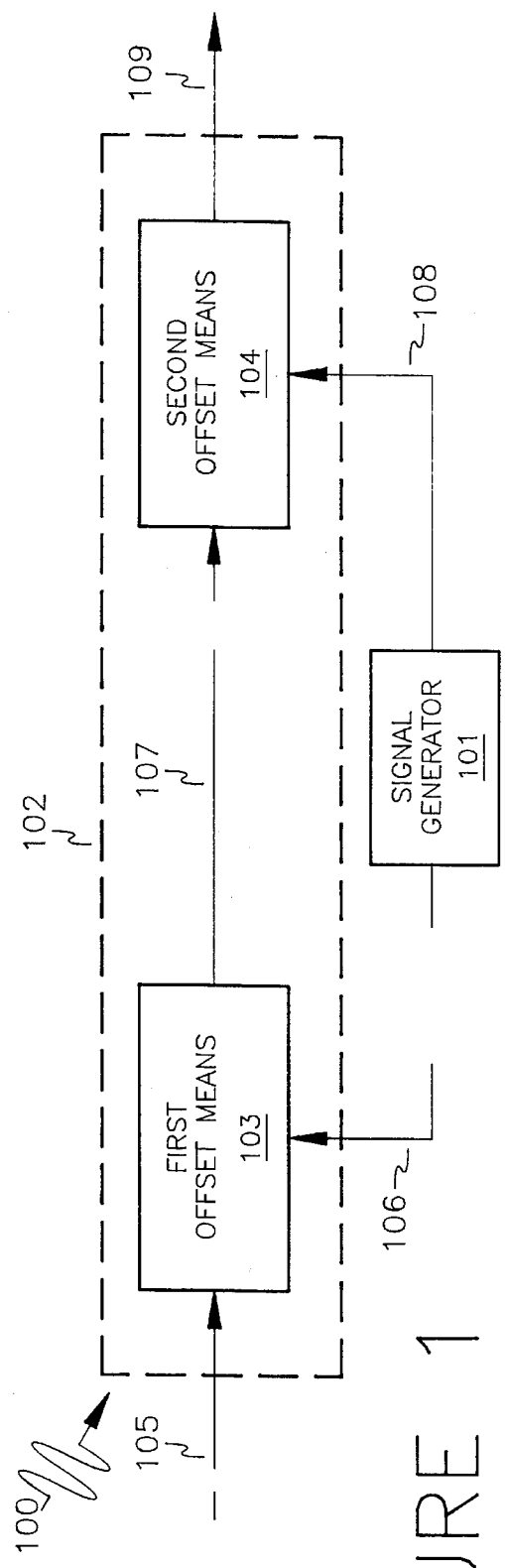
FIG. 1 is a schematic diagram of a phase shift apparatus in accordance with the present invention.

FIG. 1 shows a schematic diagram of a phase shift apparatus in accordance with the present invention. The phase shifter 100 includes a signal generator means 101, a phase shift path means 102 having a first means 103 and a second means 104. Signal generator means 101 provides two signals 106 and 108 to first means 103 and second means 104, which convert an input signal 105 to provide an output signal with a predetermined phase shift.

Figure 2A:
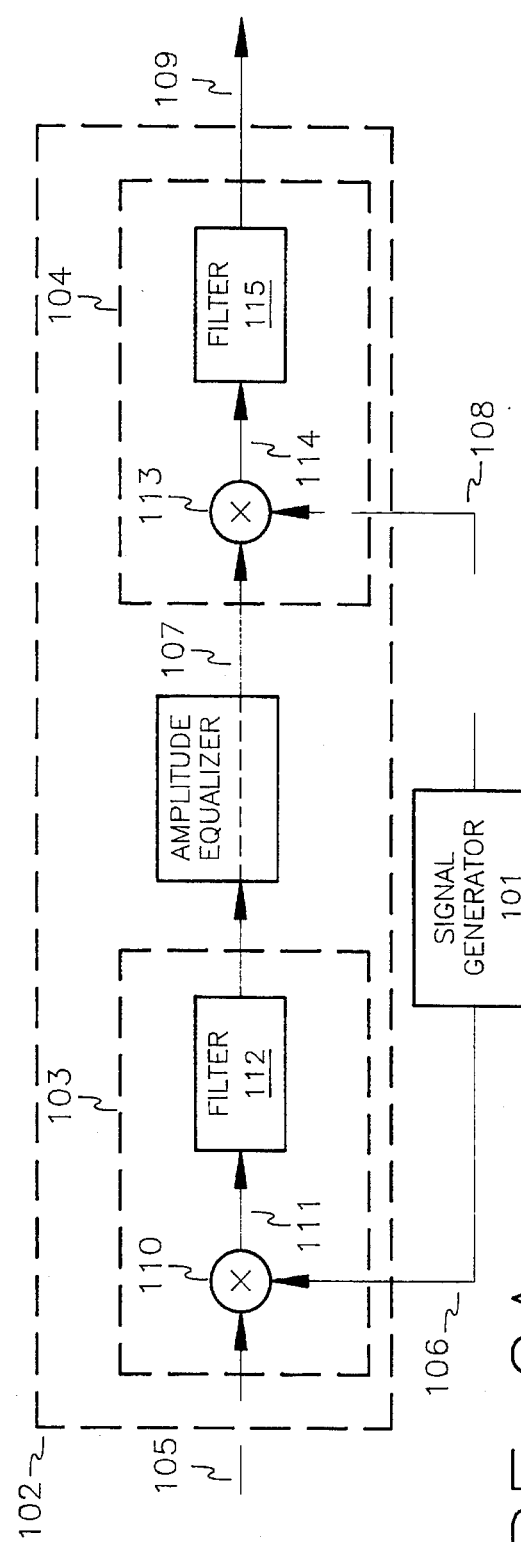
FIG. 2a is a block diagram of the phase shift apparatus shown in FIG. 1.

FIG. 2a is a block diagram of the phase shift apparatus shown in FIG. 1. First means 103 further includes multiplier means 110 and filter means 112. Second offset means 104 has a multiplier means 113 and a filter means 115. Multiplier means 110 and 113 are used for shifting the frequency and phase of the input signal. Filter means 112 and 115 are then used for selecting a signals with required frequency and phase.

Figure 2B:
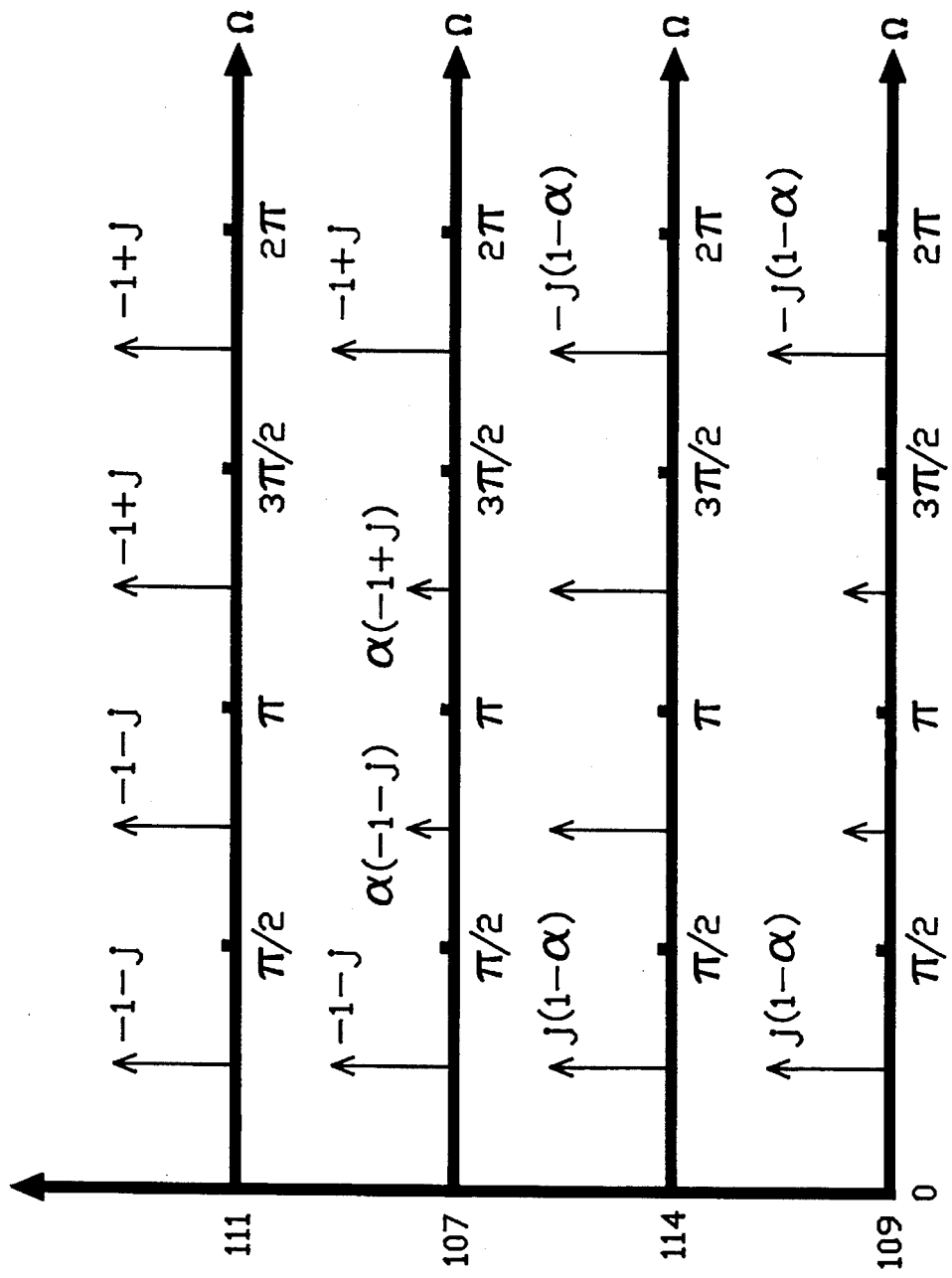
Figure 2C:
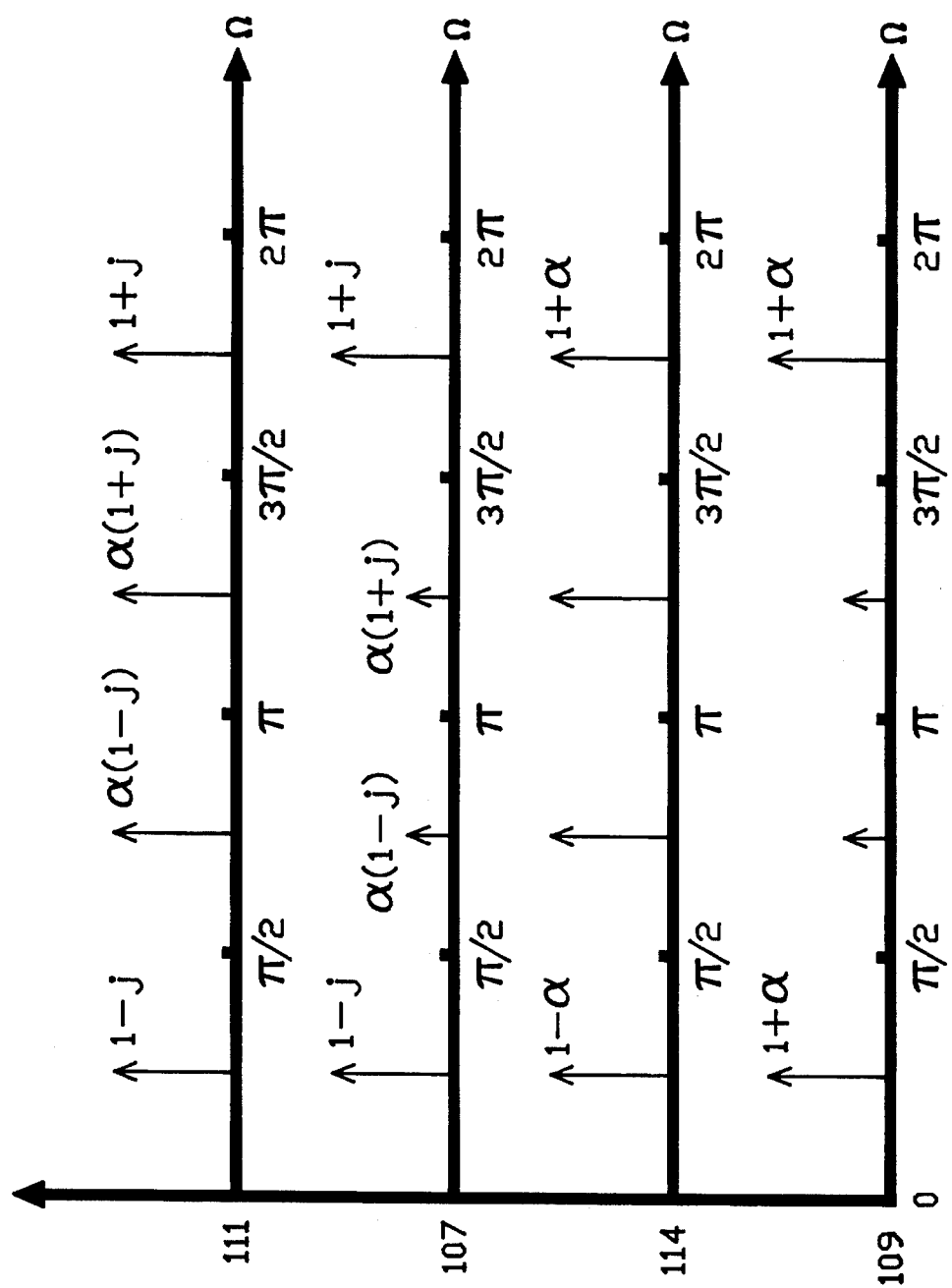

FIG. 2b, 2c are waveform diagrams of the phase shift apparatus shown in FIG. 2a, which show out the signals at respective outputs of the multiplier means 110 and 113 and filter means 112 and 115.

Figure 3:
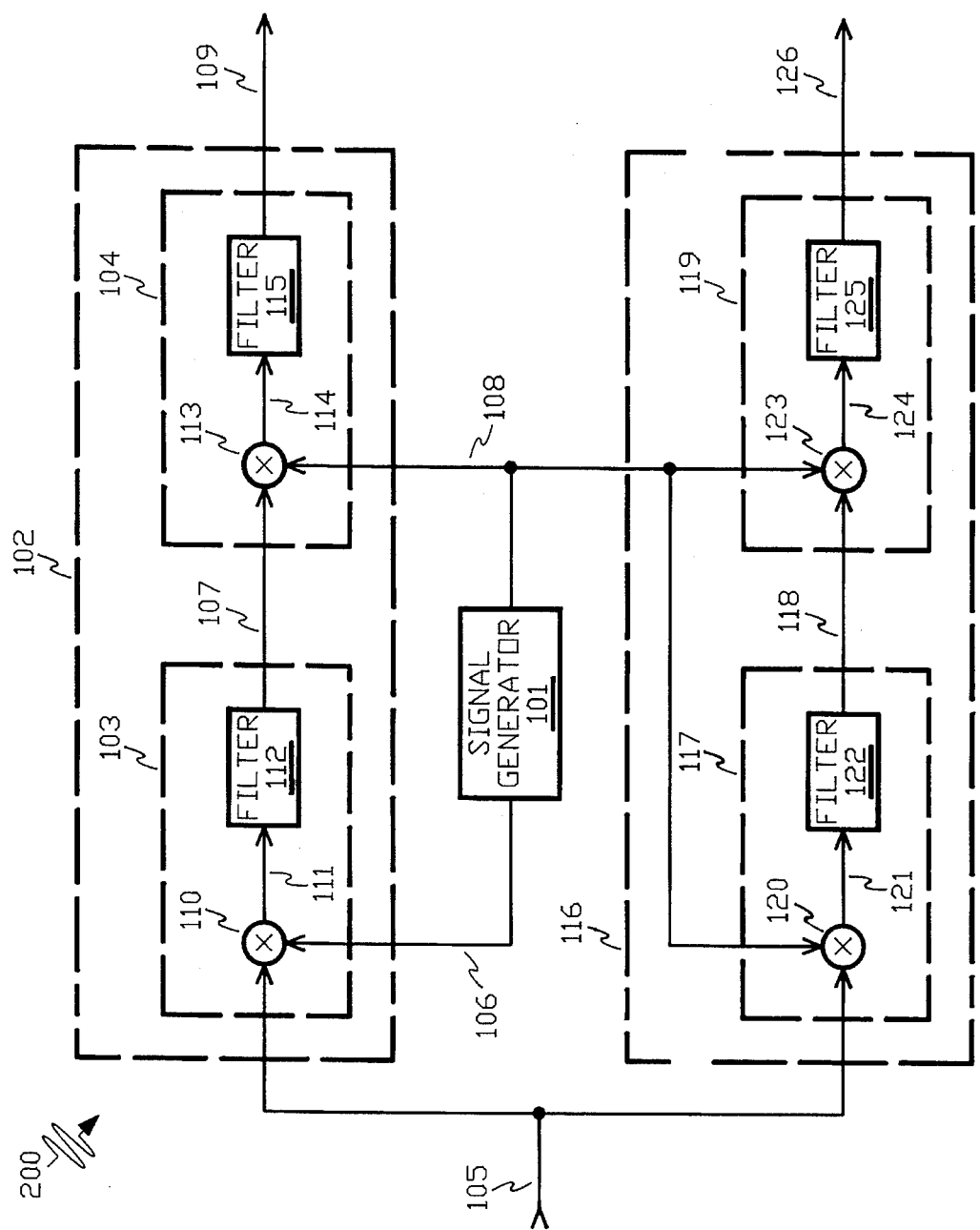
FIG. 3 is a block diagram of a first embodiment of the phase shift apparatus shown in FIG. 1.

FIG. 3 is a block diagram of a first embodiment of the phase shift apparatus shown in FIG. 1. The phase shifter apparatus comprises two path means 102 and 116. Each of them has the same components and arrangements. However, the first and second signals are coupled to the first path means 102 while only the second signal is applied to the second path means. Therefore, this apparatus provides two output signals with different phase.

Figure 4:
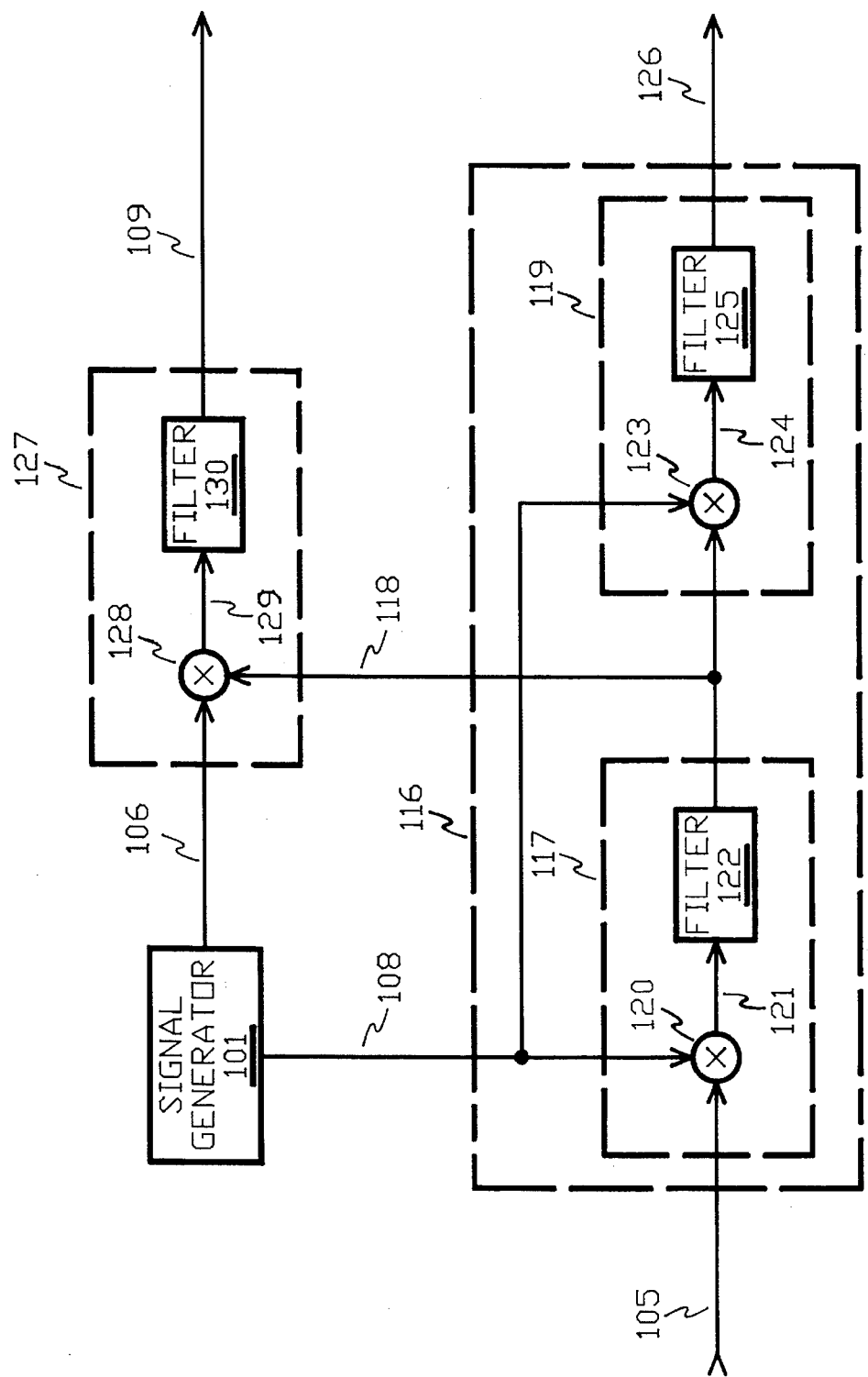
FIG. 4 is a block diagram of a embodiment of the phase shift apparatus of FIG. 1.

FIG. 4 is a block diagram of a second embodiment of the phase shift apparatus of FIG. 1. The first path means is simplified so as to only include an means 127, which receives the first signal and the output from filter means 112 to provide a signal in quadrature with the output signal 126 of second path means 116.

Figure 5:
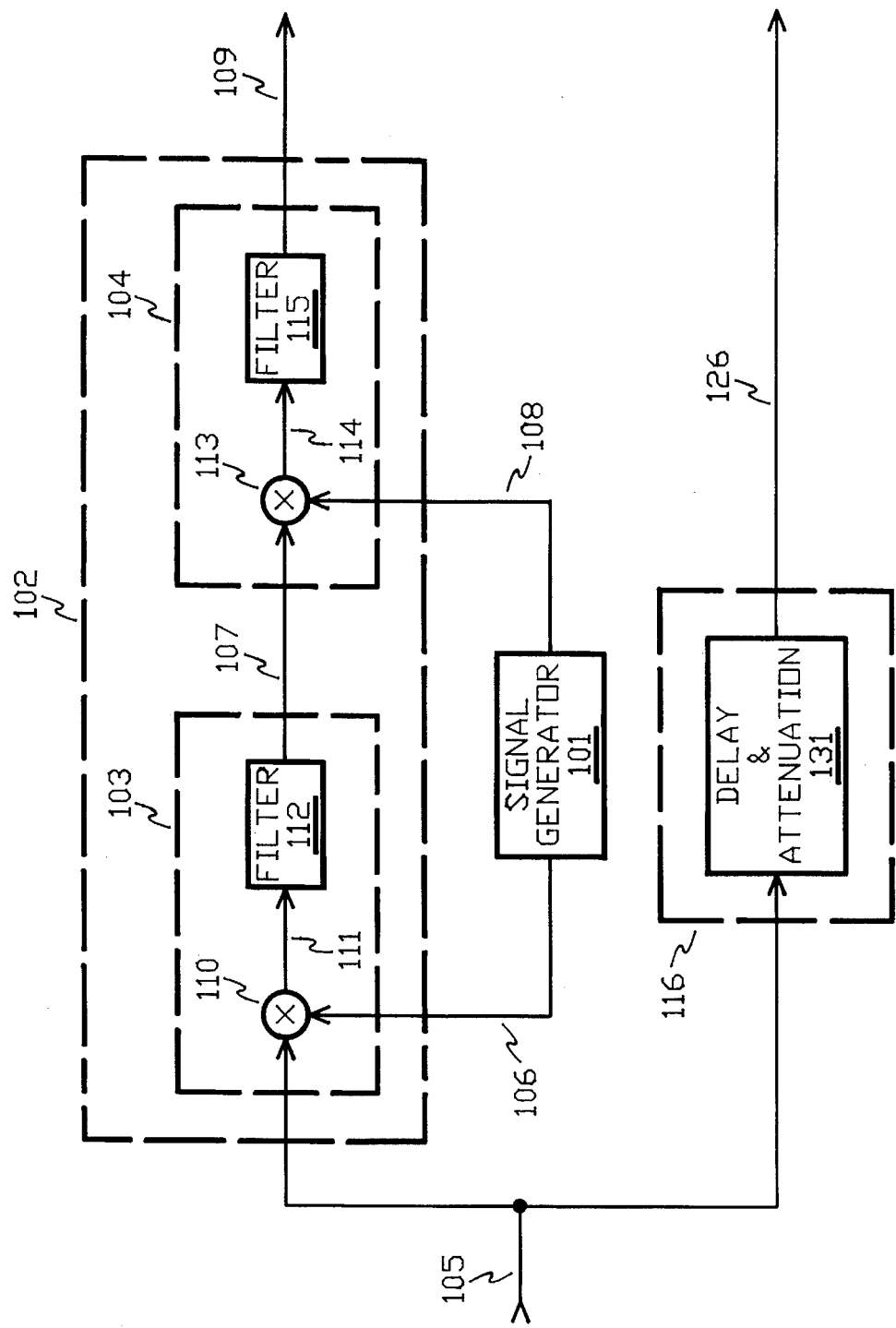
FIG. 5 is a block diagram of a third embodiment of the phase shift apparatus of FIG. 1.

FIG. 5 is a block diagram of a third embodiment of the phase shift apparatus of FIG. 1. In this embodiment, path means 116 is simplified to include a delay and attenuation 131, which delays and attenuates the input signal 105 on the basis of amount equivalent to that caused by the input signal 105 passing first path means 102. Thus, output signals of this embodiment are in quadrature.

Figure 6:
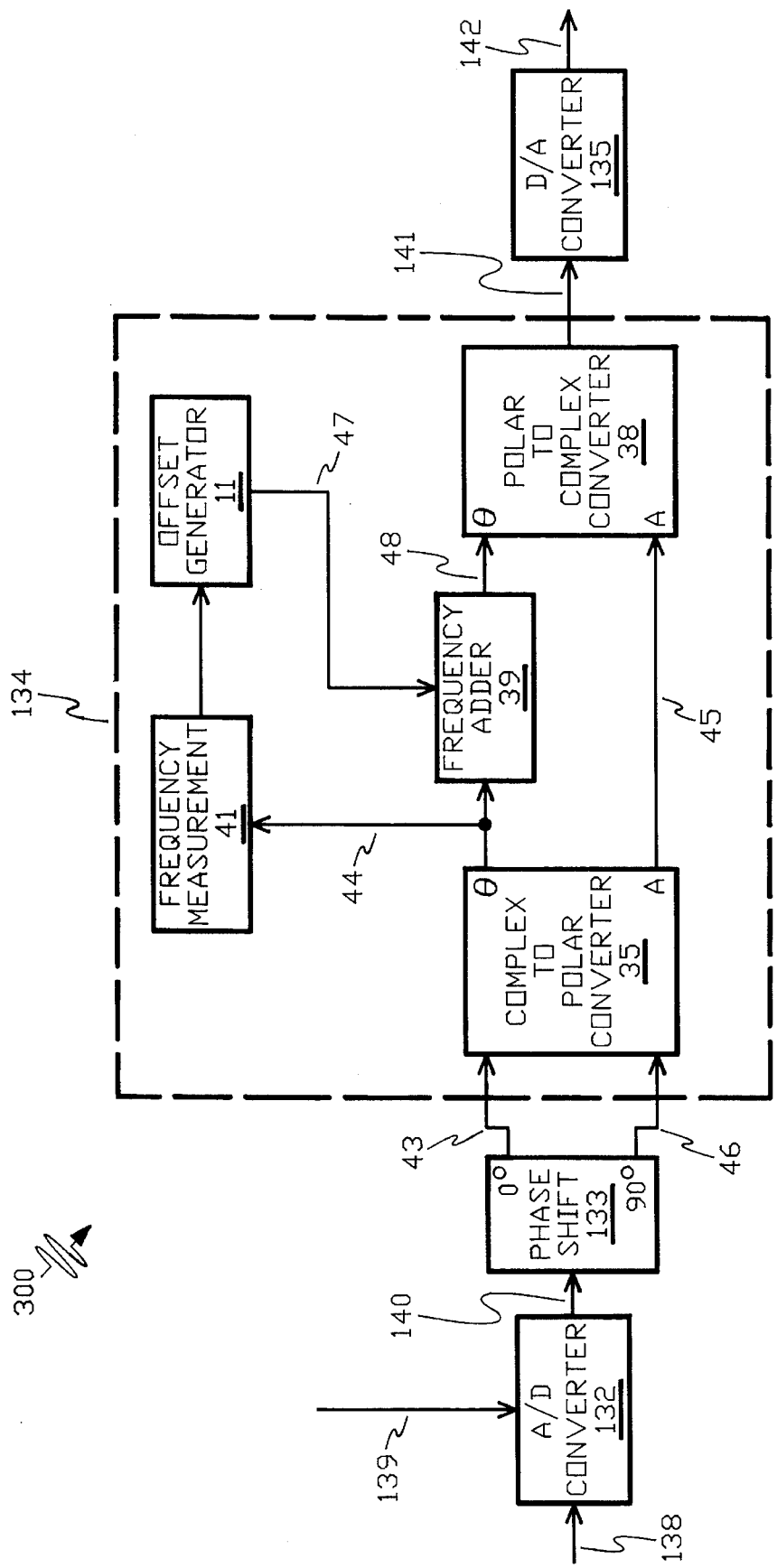
FIG. 6 is an illustrate that shows an application of the phase shift apparatus of the present invention.

FIG. 6 is an illustrate that shows an application of the phase shift apparatus in accordance with the present invention. The phase shift apparatus the present invention is used in the frequency multiplier 300 to implement phase shift of an input signal 138.

FIG. 7 is a flow chart of a shifting phase method in accordance with the present invention. The shifting phase method includes shifting the frequency and phase of an input signal respectively in response to a first and signals and selecting required output signals.

A phase shift apparatus 100 in accordance with the present invention includes signal generator means 101 and a phase shift path means 102 that includes first means 103 and second means 104, as shown in FIG. 1. An input signal 105 is applied to first means 103. The frequency content of input signal 105 can vary within a wide bandwidth. By way of example, input signal 105 may be an audio signal $\cos(w_1 \ast t)$, the frequency $w_1$ of the audio signal ranges from 2 TY*(20—20 KHz).

Signal generator means 101 provides two periodic signals 106 and 108 respectively to first means 103 and second means 104. For example, signal 106 is $\sin(w_0 \ast t)$ and 108 is $\cos(w_0 \ast t)$. The frequency $w_0$ is selected to be higher than 2 TY*20 KHz. First means 103 shifts the phase and frequency of input signal 105 in response to the signal 106, then selects a signal 107 with a phase shift and a frequency shift. The signal 107 is one of the signals resultant from mixing $w_0$ and $w_1$, $w_0+w_1$ and $w_0-w_1$, for example, $A \ast \sin(w_0-w_1)t$ (A is an attenuation factor).

Second means 104 conducts similar processing of signal 107 in response to second signal 108 as first means 103 does, thereby providing an output signal 109. The frequency $w_0-w_1$ of signal 107 is converted into the frequency the same as that of input signal 105 and its phase is the same as that of signal 107, so that the output signal 109 becomes $B \ast \sin(w_0 \ast t)$ (B is an attenuation factor). It is noted that signal 109 for the present example is in quadrature with the input signal 105. However, by changing the frequency and phase parameters of the signals 106 and 108, the output signal 109 can have different frequency and phase shifts from the input signal 105.

As another example of the present invention, both signals 106 and 108 are $\cos(w_0 \ast t)$, then the signal 107 processed by first means is converted into $A \ast \cos(w_0-w_1)t$. By the further processing in second means with signal $\cos(w_0 \ast t)$, phase shift path means 102 generates output signal 109 that is $B \ast \cos(w_1 \ast t)$. It is noted that this signal 109 has the same frequency and phase as those of the input signal 105.

It is noted from the above examples that the phase difference of signals 106 and 108 determines the phase shift between input signal 105 and output signal 109. Even the examples presented above involve in quadrature signals, the phase difference of the two signals can be set depending on required phase shift between the input and output signals.

First means includes a multiplier means 110 and a single sideband (SSB) filter means 112, and second means includes a multiplier means 113 and a SSB filter means 115, as shown in FIG. 2a. Single sideband is used as a name which describes the function of the filter means, that is to pass one sideband of the double sidebands resulting from the action of the multiplier means. signal $\sin(w_0 \ast t)$ from signal generator means 101 and the input signal $\cos(w_1 \ast t)$ are multiplied by multiplier means 110 to generate multiplication signal 111. Signal 111 is a complex signal with baseband frequency components $w_0 \pm w_1$ and possibly other higher harmonic frequency components. Thus, SSB filter means 112 is employed to select sideband signal component $A \ast \sin(w_0-w_1)t$ from signal 111, thereby providing the output signal 107. It can be noted that the frequency of the signal 107 is the difference frequency of $w_0-w_1$.

In order to obtain an output signal which has the same frequency as that of the input signal 105, signal 107, i.e. $A \ast \sin(w_0-w_1)t$, is further multiplied with the second signal 108, i.e. $\cos(w_0 \ast t)$, in multiplier means 113 so as to provide multiplication signal 114. The multiplication signal 114 is a complex signal with baseband frequency components $w_1$ and possibly other higher harmonic frequency components. All of the higher harmonic frequency components are filtered by SSB filter means 115 so that only signal $B \ast \sin(w_1 \ast t)$ is output. It is noted the final output 109 has 90 degrees phase shift and the same base frequency as input signal 105 due to the trigonometric function-product relations.

The present invention is suitable to discrete time analog and digital forms. As discrete time analog and discrete time digital are very similar, both embodiments will be described by way of example using digital PCM (Pulse Code Modulation). In digital form for example, the input signal $\cos(w_1 \ast t)$ is sampled at a sample rate at least four times higher than the highest pre-sampling input frequency so that the input signal becomes $\cos(\Omega_1 \ast n)$ ($\Omega_1 < \pi/2$). The signal 106 is a discrete signal denoted by the following equation:

$$D_n = \sin(n \ast \pi/2) - \cos(n \ast \pi/2) \qquad (1)$$

The signal 108 is also a discrete signal denoted by the following equation:

$$C_n = \sin(n \ast \pi/2) + \cos(n \ast \pi/2) \qquad (2)$$

The frequency spectrums of signals 105, 111, 107, 114 and output signal 109 are shown in FIG. 2b. The output signal spectrum 109 is $-\sin(\Omega_1 \ast n)$. Thus, the similar effect of phase shift in the analog form is realized.

Alternatively, if both signals 106 and 108 are $C_n$, the frequency spectrums of signals 111, 107, 114 and output signal 109 are shown in FIG. 2c. At this example, output signal 109 becomes $\cos(\Omega_1 \ast n)$ that is the same as input signal 105. The digital phase shift is also available to phase shift by amounts other than 90 degrees, as previously indicated for analog phase shift. Further, the first signal 106 can be applied to the second means 104 while the second signal 108 is fed to the first means 103. Switching the signals applied to means 103 and 104 will cause a reversed phase of the output signal 109. For example, when first signal 106 is $\cos(w_0 \ast t)$ while the second signal 108 is $\sin(w_0 \ast t)$, the output signal 109 will become $+B \ast \sin(w_1 \ast t)$.

An error source to be concerned with in the phase shift apparatus 100 is the finite attenuation of SSB filter means 112, which results in residual levels of the upper sideband present after the first multiplying by multiplier means 110 being folded back on top of the desired baseband (for example, $w_1$) spectrum at the second multiplier means 113. When first signal 106 is $\sin(w_0 \ast t)$ and second signal 108 is $\cos(w_0 \ast t)$, the residual signal caused by the first multiplying performed by multiplier means 110 is $A \ast \alpha \ast \sin[(w_0+w_1)t+\phi]$, wherein, $\alpha$ is the amplitude attenuation factor and $\phi$ is the phase shift error, which are caused by filter means 112.

The error item $A \ast \alpha \ast \sin[(w_0+w_1)t+\phi]$ is in combination with the desired low sideband signal $A \ast \sin(w_0-w_1)t$ so that the output signal 107 of filter means 112 becomes as follows:

$$A \ast \{\sin[(w_0-w_1)t] + \alpha \ast \sin[w_0+w_1)t+\phi]\} \qquad (3)$$

Output signal 107 is further multiplied by second signal $\cos(w_0 \ast t)$ to provides signals with baseband frequency component $w_1$ and other higher harmonic frequency components. Because frequency $w_1$ is an audio signal within 20—20 KHz range which is lower than the frequency $w_0$, the performance demands on second filter means 115 are eased. Thus, the error contribution of second filter means 115 can be ignored, with respect to in band frequencies.

The second filter means 115 passes the baseband signal components from the output 114 of multiplier means 113 so as to provide following output signal 109:

$$B \ast \{-\sin(w_1 \ast t) + \alpha \ast \sin(w_1 \ast t+\phi)\} \qquad (4)$$

Therefore, the ultimate output signal 109 includes an error item $A \ast \alpha \ast \sin(w_1 \ast t+\phi)$ and a desired baseband signal with frequency $w_1$.

When both of signals 106 and 108 are $\cos(w_0*t)$, the residual signal caused by the first multiplying performed by multiplier means 110 is $A*\alpha*\cos[(w_0+w_1)t+\phi]$. The error item $A*\alpha*\cos[(w_0+w_1)t+\phi]$ is in combination with the desired low sideband signal $A*\cos(w_0-w_1)t$ so that the output signal 107 of filter means 112 becomes as follows:

$$A*\{\cos[(w_0-w_1)t]+\alpha*\cos[w_0+w_1)t+\phi]\} \quad (5)$$

Output signal 107 is further multiplied by signal $\cos(w_0*t)$ to provide signals with baseband frequency component $w_1$ and other higher harmonic frequency components. The second filter means 115 passes the baseband signals from the output 114 of multiplier means 113 so as to provide following output signal 109:

$$B*\{\cos(w_1*t)+\alpha*\cos(w_1*t+\phi)\} \quad (6)$$

Therefore, the ultimate output signal 109 includes an error item $A*\alpha*\cos(w_1*t+\phi)$ and a desired baseband signal with frequency $w_1$.

Assuming $\alpha=1$ and $\phi=0$, which corresponds to the removal of filter means 112, when first signal 106 is $\sin(w_0*t)$ and second signal 108 is $\cos(w_0*t)$, the output 109 of phase shift apparatus becomes zero on the basis of equation (4). When both of first signal 106 and second signal 108 are $\cos(w_0*t)$, the output signal 109 of phase shift apparatus 100 is double on the basis of equation (6). If the attenuation factor B is not considered, equation (4) can be expressed as follows:

$$-\sin(w_1*t)+\alpha*\sin(w_1*t+\phi)= \quad (7)$$
$$-(1+\alpha^2-2\alpha*\cos\phi)^{1/2}*\sin\{(w_1*t)-\tan^{-1}[\alpha*\sin\phi/(1-\alpha*\cos\phi)]\}$$

Similarly, equation (6) is also expressed as follows:

$$\cos(w_1*t)+\alpha*\cos(w_1*t+\phi)= \quad (8)$$
$$(1+\alpha^2 2\alpha*\cos\phi)^{1/2}*\cos\{(w_1*t)+\tan^{-1}[(\alpha*\sin\phi)/(1+\alpha*\cos\phi)]\}$$

Equations (7) and (8) show out that the upper bound on amplitude error occurs at $\phi=0$ or 180 degrees. In this case, the amplitude error is $\alpha$. A filter means with attenuation $-20\log\alpha$ dB would guarantee an output amplitude error of $\alpha$ or less.

The upper bound on the phase error is given by following equation:

$$\phi\approx\tan^{-1}(\alpha/1-\alpha) \quad (9)$$

For example, suppose that the maximum allowable amplitude error due to the error item is 0.05 dB, then $$\alpha=10^{(0.05/20)}-1=5.77E-03 \quad (10)$$

Minimum stopband attenuation for filter means 112 is $-20\log\alpha=45$ dB. In this case, the phase error is no worse than $\tan^{-1}(\alpha/1-\alpha)=0.33$ degree. If filter means 112 has passband ripple, this must be taken into account in the error budget. The coherent amplitude error will affect the output signal in different directions, depending on whether signals 106 and 108 are in quadrature or have the same phase.

A phase shift apparatus 200 with two path means is shown in FIG. 3. First path means 102 is the same as that shown in FIG. 2a. Second path means 116 includes means 117 and 119, means 117 has multiplier means 120 and filter means 122, and means 119 has multiplier means 123 and filter means 125. The path means 102 and 116 are symmetrical. The difference between both path means is the signals applied to multiplier means 110 and 120. In first path means 102, for example, first signal 106 is $\sin(w_0*t)$ that is applied to multiplier means 110, and the second signal 108 applied to multiplier means 113 is $\cos(w_0*t)$. Therefore, the output signal 109 is shown by equation (4), which is in quadrature with the input signal 105. However, the signal 108 is applied to both of multiplier means 120 and 123 in second path means 116. Thus, the output signal 126 of second path means 116 is a signal with the same frequency and phase as those of the input signal 105, as expressed by equation (6). Thus, the phase shift apparatus of FIG. 3 provides a pair of quadrature output signals. One skilled in the art will recognize that multiple path means may be utilized to provide multiple phase shifted outputs.

A simplified version of the phase shift apparatus 200 is shown in FIG. 4. Second path means 116 is the same as that shown in FIG. 3. First path means 102 is simplified so that it only includes a means 127, which has a multiplier means 128 and a filter means 130. First signal $\sin(w_0*t)$ is applied to multiplier means 128. The output signal 118, as expressed by equation (5), is also fed to multiplier means 128 where signals 106 and 118 are multiplied. The multiplication signal from multiplier means 128 is a complex signal, including the baseband signal with frequency $w_1$ and possibly higher harmonic component signals. Due to the multiplication of signal 118 by first signal 106, the baseband signal from multiplier means 128 becomes $A*\sin(w_1*t)-A*\alpha*\sin(w_1*t+\phi)$. The second item of signal 129 is the error item from the filter means 122. Filter means 130 selects and outputs the combination baseband signal. Therefore, the phase shift apparatus shown in FIG. 4 also provides a pair of quadrature output signals.

As an alternative, the phase shift apparatus 200 shown in FIG. 3 can be implemented as shown in FIG. 5. For this embodiment, input signal 105 is a discrete signal $\cos(\Omega_1*n)$ ($\Omega_1<\pi/2$ and n is integers), first signal 106 is $C'_n=\cos(\Omega_0*n)$ and second signal 108 is $D'_n=\sin(\Omega_0*n)$ ($\Omega_0=\pi/2$). Therefore, the signal 107 output from filter means 112 becomes $$\tfrac{1}{2}*\{\cos[(\Omega_0-\Omega_1)*n]+\alpha*\cos[(\Omega_0+\Omega_1)*n]\} \quad (11)$$

This baseband signal is multiplied by second signal $D'_n$ in multiplier means 113 to provide signal 114, which includes baseband signal with frequency $\Omega_1*n$ and signals possibly with higher harmonic components. Filter means 115 further selects the baseband signal to be output. In this event, output signal 109 of first path means 102 is $\tfrac{1}{4}*(1-\alpha)*\sin(\Omega_1*n)$. Second path means 116 delays and attenuates the input signal 105 on the basis of the delay and attenuation amounts caused in the input signal 105 through first path means 102. Such delays origin from the processing elements, for example delays of filter means 112 and 115 which may be implemented as FIR (Finite Impulse Response) filters. Therefore, output signal 126 of second path means 116 is $A*\cos(\Omega_0*n)$, which has the same baseband frequency and phase as those of the input signal 105. Thus, the phase shift apparatus shown in FIG. 5 also provides a pair of quadrature output signals.

To improve the error caused by filter means 112, there are substantial requirements for the parameters of filter means 112. The error parameter α, a function of frequency, will be known and predictable from the design of the filter. An amplitude equalizer (linear phase) could be arranged at the position following filter means 112 to partially cancel α.

The phase shift apparatus in accordance with the present invention can be applied for use in the parent application, for example a frequency multiplier 300, as shown in FIG. 6. Frequency multiplier 300 includes A/D (Analog to Digital) converter 132, 0 and 90 degrees phase shift apparatus 133 in accordance with the present invention which corresponds in function to 32 of FIG. 6 of the parent application (Ser. No. 07/404,881, filed on Sep. 8, 1989), circuitry 134 having rectangular to polar coordinate converter 35, frequency adder 39, frequency measurement 41, signal generator means 11, polar to complex converter 38, which are the same elements as those shown in FIG. 6 of the parent application, and D/A (Digital to Analog) converter 135.

An audio signal 138 with bandwidth range of 20—20 KHz is applied to A/D convertor 132. Signal 139 is used to cause A/D converter 132 to sample audio signal 138. The frequency of signal 139 is selected, for example, to be 48 KHz. Phase shift apparatus 133 converts the phase of the signal 140 from A/D converter 132. Phase shift apparatus 133 can be implemented by the phase shift apparatus shown in FIGS. 3–5, implemented in digital form. In this example, the phase shift apparatus shown in FIG. 5 is preferred for digital signals.

By way of example, phase shift apparatus 133 generates 90 degrees phase shift versions of signal 140 from A/D converter 132. These 90 degrees versions, 43 and 46, may be thought of as the real and imaginary rectangular coordinate version of the signal 138. The real and imaginary signals 43 and 46 are coupled to circuitry 134 that has the same elements and arrangement as corresponding elements and arrangement of FIG. 6 of the parent application.

The real and imaginary signals 43 and 46 are coupled to rectangular to polar coordinate converter means 35, which transforms these signals to polar phase and magnitude form. A suitable I.C. for the rectangular to polar converter means is the TMC2330 manufactured by TRW LSI Products of La Jolla, Calif. This I.C. accepts the real an imaginary signals input in digital form, and output angle and magnitude signals, also in digital form. The I.C. can also be configured to perform the reverse function, i.e. it accepts angle and magnitude signals as inputs, and outputs are real and imaginary signals. One skilled in the art will recognize that the phase signals 43 and 46, which are output from 133, will need to be in digital form compatible with the TMC2330.

The amplitude information of the input signal 138 is contained within the magnitude signal 45, and phase or frequency information of the input signal 138 is contained within the phase signal 44. By multiplying the value of 44 at any given instant, the phase information is multiplied, thereby effecting as phase shift. Similarly, if the rate of multiply, or in other words the frequency of the phase signal 44 is multiplied, the effect is to multiply the frequency content of the main signal, without affecting the amplitude. Such frequency multiplication may be made with a frequency adder 39, which may alternatively operate with a frequency synthesizer means 41. The frequency adder means 39 outputs 48, a phase or frequency shifted version of the phase signal 44. Signal 48 is thus an altered version of phase signal 44.

Since phase (of the input signal) is carried by signal 44 as a magnitude or value of signal 44, a phase shift of the input signal corresponds to a magnitude or value change of 44. The shifting of phase now becomes simply the addition or subtraction of the magnitude representative of 90 degrees to signal 44. It should also be noted that this operation, i.e. addition or subtraction of a magnitude, can be carried out with simple analog or digital sum or subtract circuit. This ease of phase shift has a very beneficial effect on the operation of the frequency adder 39.

The altered or frequency shifted signal 48, output from frequency adder 39, becomes the new phase signal which is recombined with the magnitude signal 45 by the polar to complex convertor means 38. Means 38 operates to generate an output time dependent signal 141 which is derived from the altered phase and magnitude signals 48 and 45, which output signal 141 contains the same amplitude information as input signal 138, but is frequency shifted by the amount o frequency added in frequency adder means 39. Means 38 may be simply made up of a polar to rectangular convertor device, such as the previously mentioned TRW TMC2330 I.C. The output signal 142 is therefore a frequency shifted version of the input signal 138, with the frequency conversion being controlled by the frequency adder means 39.

The effect of phase shifting the input signal 138 via the frequency adder 39 is simply a function of adding that magnitude corresponding to the desired phase shift to the magnitude of 44. If 44 is representative of a continuously changing signal, that is one having a frequency content, then the magnitude or value of 44 will be constantly changing at a rate corresponding to frequency of input signal 138. By way of example, assume that the input signal 138 is a sinesuoid having an amplitude of one volt, and a frequency of 1 Hz. Further, assume that the phase signal 44 may take on a value from 0–359 arbitrary units corresponding to phase of 0–359 degrees of the input signal 138. The signal 44 will then count continuously from 0–359, roll over to 0 and count to 359 and so on as the input signal changes amplitude in time. The phase signal 44 will cycle from 0–359 at 1 Hz rate of the input signal. To multiply the phase of the input signal, as represented by the phase signal 44 at any instant, it is sufficient to merely add a value to that instant value to 44. Since 360 degrees of phase of the input signal 138 corresponds to a value of 360 at signal 44, a 90 degrees phase shift will correspond to a value of 90. In order to provide a 90 degrees phase shift, adding a value of 90 to signal 44 in a modulo 360 adder will accomplish this phase shift.

Since frequency is the continuous accumulation of phase shift, a frequency may be made by adding a continuously accumulating value to 44. Since the conversion functions 35 and 37 may be readily implemented by the TMC2330 in digital form, a digital accumulator function such as the TRW TMC2208, which contains both an accumulator and adder, will be useful as a building block for the frequency adder 39, and the generator 11. The more detailed description related to circuitry 134 may refer to the corresponding explanation in the parent application.

Finally, the signal 141 output from polar to complex 38 is fed to D/A converter 135 for converting the digital signal into analog signal 142. In circuitry 134, phase measurement 41 can use binary signal to represent the phase changes of signal 44.

A phase shifting method in accordance with the present invention is shown in FIG. 7. An input signal to be shifted in phase is provided with the two periodic signals, at step 401. By way of example, the input signal is a cosinesuoid function with frequency $w_1$. The first signal is a sinesuoid function and the second signal is a cosinesuoid function, which have the same frequency $w_0$.

The first signal is used to shift the frequency and phase of the input signal at step 402. The shifted signal includes signals with sideband components and higher harmonic components. The phase of the sideband signals is in quadrature with that of the input signal. Only one sideband signal, for example, the lower sideband is selected, at step 403, to further process. At step 404, the lower sideband signal is shifted by the second signal back to the baseband signal. After the second ting, the frequency of the baseband signal has been converted back to the same frequency as that of the input signal. Because the second offset signal is a cosine-suoid function with frequency $w_0$, the phase of the lower sideband signal is not converted. Accordingly, a signal with base frequency $w_1$ is generated. At step 405, the signal with base frequency $w_1$ is selected to be output. Therefore, the output signal has the same frequency as that of the input signal, but is in quadrature with the input signal.

Signal generator means 101 may be implemented with a numerically controlled quadrature output oscillator such as the ST-1172A from Standford Telecommunications, Santa Clara, Calif. The ST-1172A provides digital sine and cosine outputs which may be converted into analog signals utilizing two D-A convertors. Alternatively, the STEL-1272B is a board level product which may provide analog sine and cosine signals 106 and 108. Multiplier means, such as 110, 113, 120 and 123, may be implemented by analog multiplier means such as the AD834 or AD734 from Analog Devices, Norwood, Mass., or in digital form by the TMC216H or MPY016K from TRW LSI Products, La Jolla, Calif. Filter means such as 112, 115 122 and 125 may be implemented with Matthey TBW Series analog (LC type) filers available from Television Equipment Associates, South Sulem, N.Y. or with the Digital TMC 2242 from TRW, or alternatively with numerous other analog or digital filters available in the art. The specifications of the filters will be dependent on the desired overall performance of the phase shift function implemented by the present invention, and one skilled in the art will be able to select components and filter specifications to implement practical embodiments.

One skilled in the art will recognize that the above described functions and components are somewhat more complex than represented by the present block diagrams, however from the disclosure and teachings herein, taken with the available applications literature available from the manufacturers of the suggested components, or from other components which may be substituted as will be known from the above disclosure, the construction of a practical and operatable device will be well within the capability of one or ordinary skill in the art without resorting to further invention or undue experimentation.

It will be understood that the previous descriptions and explanations are given by way of example, and that numerous changes in the combinations of elements and functions as well as changes in design of the above may be made without departing from the spirit and scope of the invention as hereinafter claimed. In particular, the invention may be practiced in various forms which rely upon trigonometric equalities and identities, and signals may take on either analog or digital form. In addition, it will be useful to combine the functions of the invention with other functions in a fashion so that such functions may be shared between devices or methods. These and other modification to and variations upon the embodiments described above are provided for by the present invention, the scope of which is limited only by the following claims.

We claim:

1. An apparatus for shifting a phase of an input signal, said apparatus including means for generating at least a first selected repetitive offset signal and a second selected repetitive offset signal having a selected frequency and phase relationship, and means for converting the phase of said input signal in response to said first and second selected repetitive offset signals so as to provide at least a first output signal, said first and second selected repetitive offset signals coupled to said converting means which generates at least an internal signal having a frequency different from said input signal, said output signal having a frequency the same as that of said input signal, and said output signal having a predetermined phase shift with respect to said input signal.

2. An apparatus as recited in claim 1 wherein said first offset signal and said second offset signal are selected repetitive signals having differing frequencies.

3. An apparatus as recited in claim 2 wherein said first offset selected repetitive signal has a frequency the same as that of said second offset selected repetitive signal, and said predetermined phase shift is determined by a phase difference of said first and second selected repetitive offset signals.

4. An apparatus as recited in claim 3 wherein said predetermined phase shift is substantially 90°.

5. An apparatus as recited in claim 4 wherein said input signal has a bandwidth range greater than one octave.

6. An apparatus for shifting a phase of an input signal having a variable frequency, said apparatus including means for generating a first selected repetitive offset signal and a second selected repetitive offset signal, said first and second selected repetitive offset signals having a selected mutual phase difference and a frequency difference with respect to said input signal, first path means which generates at least an intermediate signal having a frequency different from said input signal for converting the phase of said input signal in response to said first and second selected repetitive offset signals to produce a first output signal, said first output signal having a frequency the same as that of said input signal and a predetermined phase shift determined by said phase difference, and second path means for processing at least said input in response to one of the first and second selected repetitive offset signals to produce a second output signal in correspondence to said first output signal, said second output signal having a frequency and a phase matching those of said input signal.

7. An apparatus as recited in claim 1, 2, 3, 4, 5, or 6 wherein said predetermined phase shift of said first output signal with respect to said input signal is changeable and is determined by a changeable phase difference of said first and second selected repetitive offset signals, said means for generating being operable to change said selected phase relationship of said selected repetitive offset signals.

8. An apparatus as recited in claim 1, 2, 3, 4, 5, or 6 further including means responsive to said-first output signal to alter at least the frequency shifted version of said input signal.

9. An apparatus as recited in claim 6 further including means responsive to said first output signal and said second output signal to provide a plurality of signals representative of said input signal one of which is a phase signal responsive to phase information of said input signal, and means to alter at least said phase signal to provide an altered phase signal, and means responsive to at least said altered phase signal to provide a frequency shifted version of said input signal.

* * * * *